(12) United States Patent
Liu et al.

(10) Patent No.: US 8,234,547 B2
(45) Date of Patent: Jul. 31, 2012

(54) SEAMLESS HANDOVER OF MULTICAST SESSIONS IN INTERNET PROTOCOL BASED WIRELESS NETWORKS USING STAGGERCASTING

(75) Inventors: Hang Liu, Yardley, PA (US); Kumar Ramaswamy, Princeton, NJ (US)

(73) Assignee: Thomson Licensing, Issy les Moulineaux (FR)

( * ) Notice: Subject to any disclaimer, the term of this patent is extended or adjusted under 35 U.S.C. 154(b) by 834 days.

(21) Appl. No.: 12/226,799

(22) PCT Filed: Apr. 29, 2006

(86) PCT No.: PCT/US2006/016298
§ 371 (c)(1),
(2), (4) Date: Feb. 5, 2009

(87) PCT Pub. No.: WO2007/130012
PCT Pub. Date: Nov. 15, 2007

(65) Prior Publication Data
US 2009/0319845 A1    Dec. 24, 2009

(51) Int. Cl.
*H03M 13/00*    (2006.01)
(52) U.S. Cl. ...................................................... 714/774
(58) Field of Classification Search .................. 714/18, 714/748–752, 774, 776; 370/342, 392, 432
See application file for complete search history.

(56) References Cited

U.S. PATENT DOCUMENTS
6,278,716 B1 * 8/2001 Rubenstein et al. .......... 370/432
(Continued)

FOREIGN PATENT DOCUMENTS
JP    2004349891 A    12/2004
(Continued)

OTHER PUBLICATIONS
International Search Report, dated Jan. 23, 2007.

*Primary Examiner* — Shelly A Chase
(74) *Attorney, Agent, or Firm* — Robert D. Shedd; Jeffrey M. Navon; Catherine A. Cooper

(57) ABSTRACT

A method and apparatus are described for recovering from loss of an original data packet, including detecting data packet loss, joining a delayed multicast group, receiving a delayed data packet and using the delayed data packet to recover the original data packet that was lost. The delayed data packet is one of a copy of the original data packet, a copy of the original data packet encoded at a lower bit rate or a parity packet. Also described are a method and apparatus for staggercasting including encoding and compressing a first data sequence, packetizing the compressed encoded data sequence to form a data packet, multicasting the data packet to a first multicast group, encoding and compressing a second data sequence, packetizing the compressed encoded second data sequence to form a packet and multicasting the packet delayed by an offset time to a second multicast group.

36 Claims, 16 Drawing Sheets

U.S. PATENT DOCUMENTS

| | | |
|---|---|---|
| 6,317,462 B1 | 11/2001 | Boyce |
| 6,421,387 B1 | 7/2002 | Rhee |
| 7,042,833 B1 | 5/2006 | George et al. |
| 7,443,797 B2 | 10/2008 | Cheung et al. |
| 7,447,148 B2 * | 11/2008 | Gao et al. .................. 370/216 |
| 2002/0114283 A1 | 8/2002 | Lee |
| 2002/0133615 A1 | 9/2002 | Satran et al. |
| 2003/0135784 A1 | 7/2003 | Yamaguchi et al. |
| 2004/0102932 A1 | 5/2004 | Fukushima et al. |

FOREIGN PATENT DOCUMENTS

| | | |
|---|---|---|
| JP | 2006093812 A | 4/2006 |
| WO | WO2004068838 | 8/2004 |
| WO | WO2004070952 | 8/2004 |
| WO | 2005022813 A1 | 3/2005 |
| WO | WO2005046125 | 5/2005 |

* cited by examiner

SEAMLESS HANDOVER OF MULTICAST SESSIONS IN INTERNET PROTOCOL BASED WIRELESS NETWORKS USING STAGGERCASTING

This application claims the benefit, under 35 U.S.C. §365 of International Application PCT/US2006/16298, filed on May 29, 2006, which was published in accordance with PCT Article 21(2) on Nov. 15, 2007.

BACKGROUND OF THE INVENTION

In video multicast/broadcast over IP-based wireless networks, video data is encapsulated in UDP/IP packets and multicast/broadcast to the mobile devices over wireless networks. The IP-based wireless networks can be wireless local area networks (WLANs), cellular networks, wireless metropolitan area networks (WMANs) and wireless regional area networks (WRANs). When a mobile device moves from one cell to another, it is handed-over/handed-off from the base station (BS)/access point (AP) with which it is currently associated to another BS/AP. The two BSs/APs generally operate at different frequencies/channels. A number of packets are lost when the mobile device changes operating frequency to associate with the new BS/AP.

Typically, a broadcast signal is transmitted to all possible receivers simultaneously. A multicast signal is transmitted to a selected subset (one or more) of all possible receivers in a group simultaneously. As used herein multicast also includes broadcast. That is, a multicast signal may be transmitted to a selected subset of all possible receivers in a group where the selected subset may include the entire set of all possible receivers, i.e. the multicast group is all receivers.

In wireless systems, channel coding is used at the physical layer to protect packets against multipath fading and interference. However, channel coding cannot recover burst packet loss during handovers/handoffs.

One prior art method provides for transmission of duplicate data time-delayed/time-shifted from the original data (staggercasting) in an ATSC system to improve broadcast system robustness. When duplicate, time-staggered streams are sent, the system can tolerate signal loss up to the duration of the time shift between the two streams. Another prior art method provides a lower bit rate version of the original data (instead of the exact original data) is repetitively transmitted with a time delay. This approach reduces the bandwidth used by the redundant data. However, both of these prior art schemes send a composite signal and always send the signals whether or not there are any clients/receivers that want/need the data.

Yet another prior art method provided for the use of cross-packet forward error correction (FEC) codes to protect against synchronization loss in an ATSC system. FEC codes have also been used to recover lost packets in IP-based wireless networks. In general, an erroneous packet is discarded by the link layer. The FEC codes are applied across data packets at the transport and application layers and erasure decoding is used to recover the lost packets. However, the FEC parity packets are generally sent together with the data packet. During handoffs/handovers, long error bursts may occur. These long error bursts lead to the loss of data packets and parity packets exceeding the FEC capability, so that the lost data packets cannot be recovered.

The problem addressed and solved by the present invention is how to protect against packet loss during handoff/handover for high-quality video multicast/broadcast over IP-based wireless networks.

SUMMARY OF THE INVENTION

In wireless networks, a mobile device may be handed-over/handed-off from one base station/access point to another base station/access point. The data transmitted during these handover/handoff periods are lost to the receiver/mobile device. The present invention provides a method and apparatus to recover from data packet loss for seamless handoff/handover by repeatedly transmitting data packets with a time shift (staggercasting). Alternative embodiments are also provided, including staggercasting a lower bit rate version of the original data or staggercasting parity data generated by a cross-packet forward error correction code.

The system described herein includes one or more server(s)/sender(s)/transmitter(s), wireless base stations or access points, Ethernet switches, and receivers. A receiver as used herein is typically a mobile device. Mobile devices include, but are not limited to, mobile telephones, cellular telephones, mobile terminals, personal digital assistants (PDAs) and laptops.

The normal/original data and the time-shifted data are transmitted in a backwards compatible manner using different IP multicast groups. That is, if a mobile device does not have the capability provided in the present invention, it can still receive the normal data packets alone with low system resilience to packet loss. The delayed recovery packets are discarded by the mobile device. This achieves backward compatibility with legacy devices.

A method and apparatus are described for recovering from loss of an original data packet, including detecting data packet loss, joining a delayed multicast group, receiving a delayed data packet and using the delayed data packet to recover the original data packet that was lost. The delayed data packet is one of a copy of the original data packet, a copy of the original data packet encoded at a lower bit rate or a parity packet. Also described are a method and apparatus for staggercasting including encoding and compressing a first data sequence, packetizing the compressed encoded data sequence to form a data packet, multicasting the data packet to a first multicast group, encoding and compressing a second data sequence, packetizing the compressed encoded second data sequence to form a packet and multicasting the packet delayed by an offset time to a second multicast group. The packet is one of a copy of the original data packet, a copy of the original data packet encoded at a lower bit rate or a parity packet.

BRIEF DESCRIPTION OF THE DRAWINGS

The present invention is best understood from the following detailed description when read in conjunction with the accompanying drawings. The drawings include the following figures briefly described below where like-numbers on the figures represent similar elements.

DETAILED DESCRIPTION OF THE PREFERRED EMBODIMENTS

The present invention is directed to staggercasting in wireless networks to recover from the data packet loss during handoff/handover. This is accomplished by repeatedly transmitting data packets with a time shift/time delay. The data packets may be copies of the original/normal data packets or alternatively a lower bit rate version of the original data packets. Furthermore, the present invention provides another alternative embodiment for staggercasting the parity data generated by a cross-packet FEC code. The present invention is independent of video coding schemes. The present invention can also be used to transmit audio streams although video multicast over wireless networks is used as an example to explain the invention.

Figure 1:
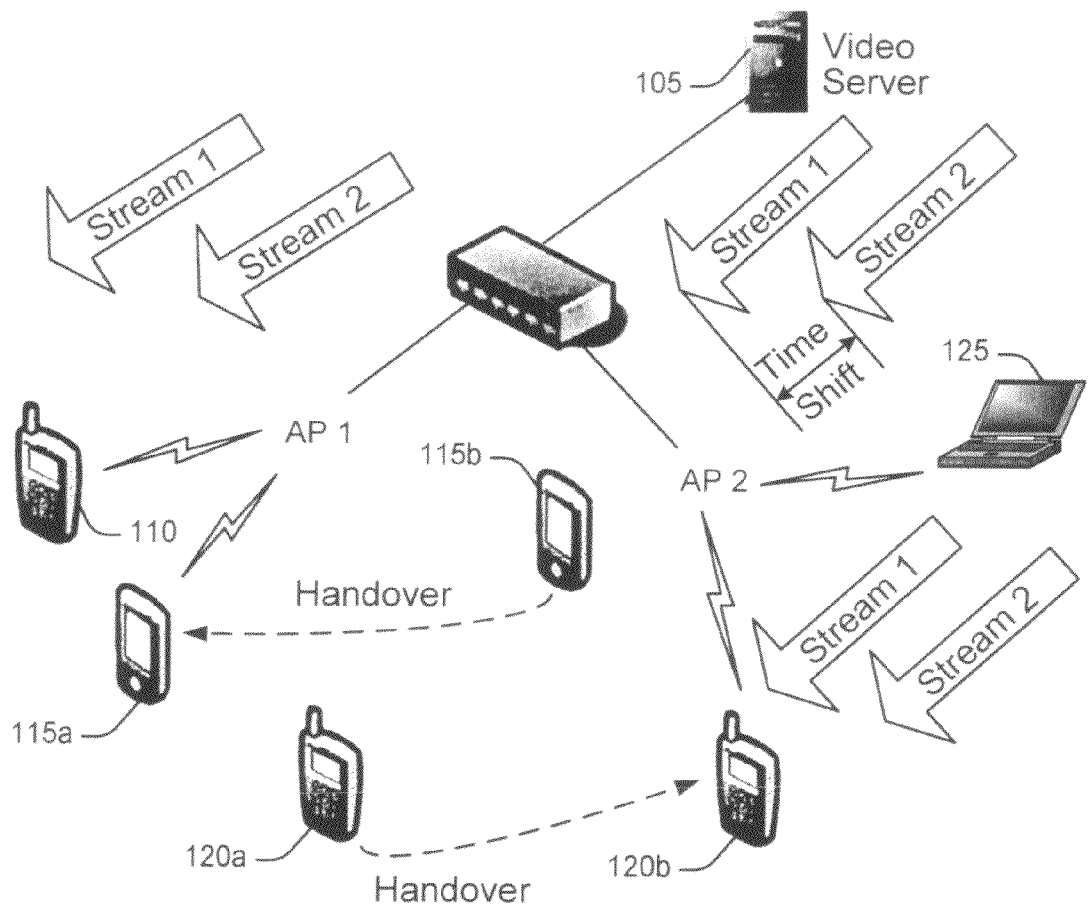
FIG. 1 is a schematic diagram of a multicast system in an internet protocol based wireless network using staggercasting.

Referring to FIG. 1, a typical network system in accordance with the present invention is shown. Multiple base stations/access points AP1, AP2 form a cellular network to increase the coverage. To reduce the interference, the adjacent wireless base stations/access points AP1/AP2 are operated in different frequency carriers/wireless channels. At least one video server 105 is connected to multiple wireless base stations (BSs) or access points (APs) through high-speed Ethernet LANs or other wired high-speed networks. The video server 105 includes among other components a video encoder/transcoder and a packetizer. For live video multicast/broadcast, the video contents are encoded/transcoded, packetized and then multicast to a number of mobile clients (110, 115a, 115b, 120a, 120b, 125) through wireless base stations/access points AP1, AP2. Pre-coded video contents can also be packetized and then multicast to a number of mobile clients through wireless base stations/access points.

When a mobile device (e.g., 115a, 120b) moves from one cell to another, the mobile device is handed-over/handed-off from the base station (BS)/access point (AP) with which it is currently associated to another BS/AP. A number of packets may be lost when the mobile device (115a, 120b) changes its operating frequency to associate with the new BS/AP. To recover from packet loss and achieve seamless handover, the present invention provides for simulcasting the same video content (data packets) with a time shift. The normal video packet stream is sent to all the base stations/access points in an IP multicast group (normal video multicast group). In addition, a duplicate, time-staggered/shifted/delayed version of the normal video packet stream is sent to all the mobile devices in another IP multicast group (delayed recovery multicast group). This technique is called staggercasting herein. The normal video stream and the time-shifted video stream provide time-diversity to improve system robustness in the handover/handoff situation. The system can transparently tolerate the packet loss up to the duration of time shift.

When a mobile device is handed-off from a BS/AP to an adjacent BS/AP, the mobile device sends a request to the new BS/AP to join/subscribe to both the normal video multicast group and the delayed video multicast group either when an error is detected or as soon as a handoff/handover situation occurs. The new BS/AP transmits/multicasts both the normal video packet stream and the delayed video packet stream in multicast over the wireless link. The mobile device receives both of the streams. If the mobile device detects that some packets or a video segment (a few video frames or Group of Frames (GOF)) are lost in the normal video packet stream, then the mobile device switches to the time-delayed video packet stream to recover the lost packets or video segment of the original video packet stream. If the time shift duration/period between the normal video packet stream and the delayed video packet stream is greater than the handoff time, the lost video data can be recovered. After the lost data in the normal video packet stream are recovered, the mobile device can send a request to the BS/AP to leave/unsubscribe/exit the delayed video multicast group. If no mobile device associated with a BS/AP wants the data for a multicast group (normal video data or delayed video data), i.e. there are no members of a multicast group, the BS/AP will not transmit data for this multicast group in wireless networks, but discards the data. This saves wireless bandwidth. The Internet Multicast Management Protocol (IGMP) or other protocols can be used for the mobile device to request the BS/AP to join or leave a multicast group. In an alternative embodiment, the mobile device sends the request to the Ethernet switch to join or leave a multicast group. If no mobile device associated with a BS/AP wants the data for a multicast group, the Ethernet switch will not transmit the data for that multicast group to the BS/AP.

In particular, still referring to FIG. 1, mobile device 115b moves from a cell serviced/supported by AP2 to a cell serviced/supported by AP1. In so doing, mobile device (now 115a—supported by AP1) requests AP1 to join/subscribe to the normal and delayed video multicast groups, and receives both the normal video packet stream (stream 1) and the delayed/time-shifted version of the video packet stream (stream 2). If errors are detected (some packets or a video segment are/is lost) in the normal video packet stream, then the mobile device switches to the time-delayed video packet stream to recover the lost packets or video segment of the original video packet stream. If the time shift duration between the normal video packet stream and the delayed video packet stream is greater than the handoff time, the lost video data can be recovered. After the lost data in the normal video packet stream are recovered, the mobile device 115a can send a request to the BS/AP to leave/unsubscribe/exit the delayed video multicast group.

Similarly, mobile device 120a moves from a cell serviced/supported by AP1 to a cell serviced/supported by AP2. In so doing, mobile device (now 120b—supported by AP2) requests AP2 to join/subscribe to the normal and delayed video multicast groups, and receives both the normal video packet stream (stream 1) and the delayed/time-shifted version of the video packet stream (stream 2). If errors are detected (some packets or a video segment are/is lost) in the normal video packet stream, then the mobile device switches to the time-delayed video packet stream to recover the lost packets or video segment of the original video packet stream. If the time shift duration between the normal video packet stream and the delayed video packet stream is greater than the handoff time, the lost video data can be recovered. After the lost data in the normal video packet stream are recovered, the mobile device 120b can send a request to the BS/AP to leave/unsubscribe/exit the delayed video multicast group.

Figure 2A:
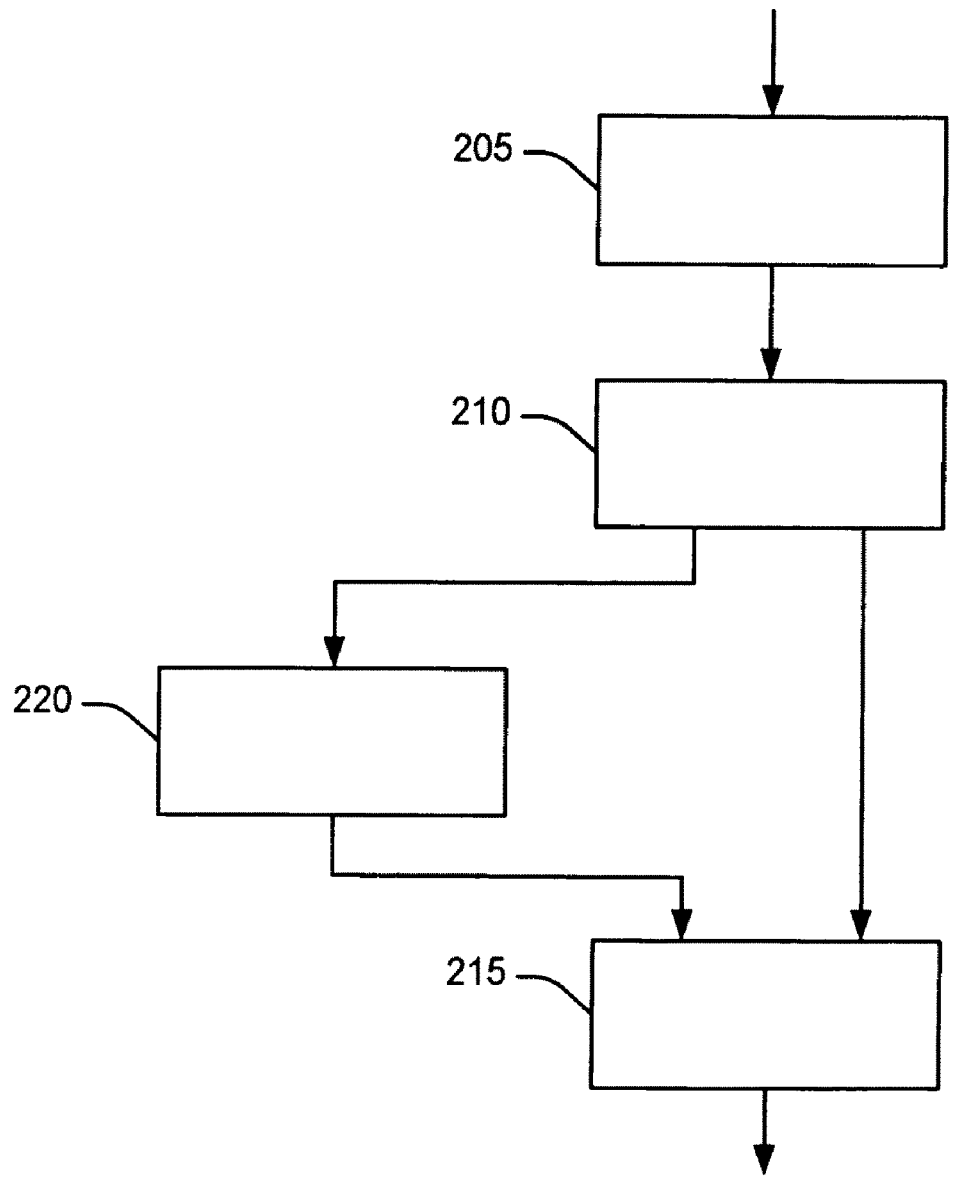
FIG. 2a is a flowchart of an exemplary staggercasting video server/sender implementation in accordance with the principles of the present invention.

FIG. 2a is a flowchart of an exemplary video server/sender staggercasting implementation for video multicast over IP-based wireless networks in accordance with the present invention. The source encoder/transcoder encodes/compresses the uncompressed video data sequence at 205. The possible video coding formats include H.264, MPEG-2, etc. The compressed video is packetized by the packetizer and the packet header is added at 210. If the real-time transport protocol (RTP) is used for video multicast, the packet header is RTP header. The RTP data packets are encapsulated in UDP and multicast in an IP multicast group (normal video multicast group) at step 215. A copy of these packetized compressed video data packets is also stored for an offset time $T_d$ at 220. The video data (normal and delayed) are transmitted/multicast at 215. The delayed version of the video packets are transmitted/multicast to another IP multicast group (delayed recovery multicast group).

Figure 2B:
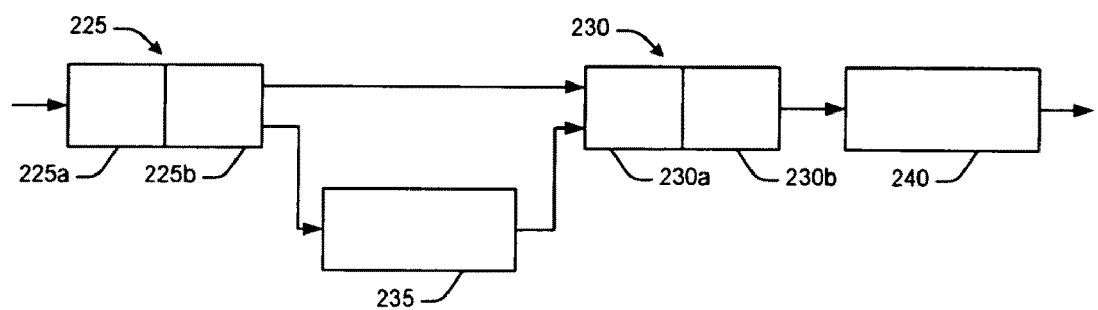
FIG. 2b is a schematic diagram of an exemplary staggercasting video server/sender implementation in accordance with the principles of the present invention.

FIG. 2b is a schematic diagram of an exemplary video server/sender staggercasting implementation for video multicast over IP-based wireless networks in accordance with the present invention. Uncompressed video sequence data is received by a video server/sender 225. The video server/sender includes at least a video transcoder/encoder 225a and a video packetizer 225b. The video transcoder/encoder compresses the video sequence data. The video sequence data is then packetized and sent to both a protocol stack 230 and a delay buffer 235. Protocol stack 230 includes at least UDP 230a and IP 230b. The delay buffer 235 stores a copy of the packetized compressed video sequence data for an offset time $T_d$. The delayed packetized compressed video sequence data is communicated to the protocol stack after offset time $T_d$. The packetized compressed video sequence data (normal and delayed data packets) are communicated to the Ethernet interface 240, which transmits/multicasts the normal/original video data packets to a normal/original multicast group and transmits/multicasts the delayed video packets to a delayed multicast group. The components described herein may be hardware, software or firmware or any combination thereof including RISC; ASIC and/or FPGA.

Figure 3A:
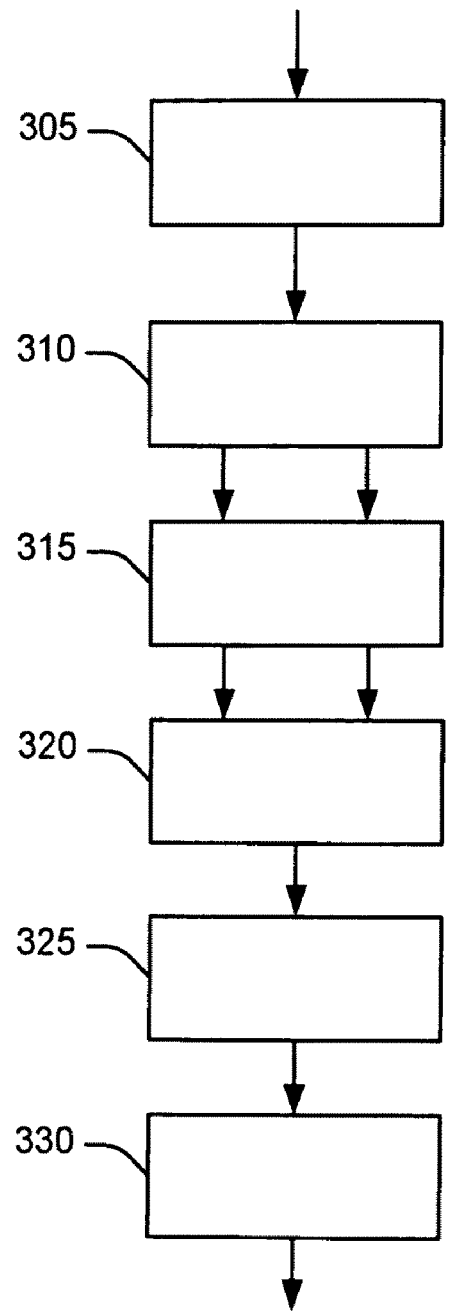
FIG. 3a is a flowchart of an exemplary staggercasting mobile receiver implementation in accordance with the principles of the present invention.

FIG. 3a is a flowchart of an exemplary mobile receiver/device implementation for video multicast over IP-based wireless networks in accordance with the present invention. The original/normal video packets and the delayed video packets are received from different multicast groups at 305. The normal video packets (video sequence data) and delayed video packets (video sequence data) are separated into a normal video packet stream and a delayed video packet stream at 310. Error detection and correction is performed at 315. Error detection is performed to determine whether packets were missing in the normal video packet stream by recognizing the gaps in received packet sequence number. The normal video packet stream is stored at 320. If the packet loss is detected in the normal video packet stream, the packets in the delayed video packet stream corresponding to the missing packets of the normal video packet stream are selected and inserted in the normal video packet steam in the delay buffer to recover/correct the packet loss in the normal video packet stream. The recovered video packets are depacketized. The depacketized video stream is decoded at 330.

Figure 3B:
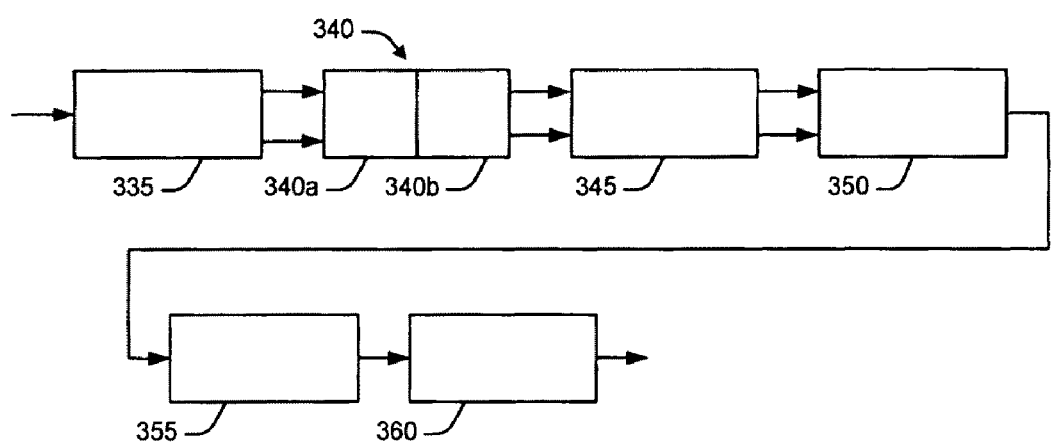
FIG. 3b is a schematic diagram of an exemplary staggercasting mobile receiver implementation in accordance with the principles of the present invention.

FIG. 3b is a schematic diagram of an exemplary mobile receiver/device implementation for video multicast over IP-based wireless networks in accordance with the present invention. An Ethernet/WLAN interface 335 receives video sequence data (data packets) from both a normal multicast group and a delayed multicast group. The Ethernet/WLAN interface communicates the normal/original video sequence data (data packets) and the delayed video sequence data (data packets) to a protocol stack 340, which includes at least a UDP layer 340a and an IP layer 340b. The protocol stack 340 separates the received video sequence data into a normal video packet stream and a delayed video packet stream and communicates the normal video packet stream and the delayed video packet stream to an error detection and correction module 345. Error detection is performed by the error detection and correction module 345 to determine whether packets were missing in the normal video packet stream by recognizing the gaps in received packet sequence number. The normal video packets are stored in a delay buffer 350 for a certain time (offset time). If packet loss is detected, the error detection and correction module 345 informs a control module (not shown). The control module sends a request (on behalf of the mobile device) to the BS/AP to join the delayed multicast group. The packets in the delayed video packet stream corresponding to the missing packets of the normal video packet stream are inserted in the normal video packet stream in the delay buffer 350 after they arrive. The recovered video sequence data are passed to the de-packetization module 355 and are depacketized. The depacketized video sequence data is communicated to a video decoder 360. The video decoder 360 decodes the depacketized recovered video. It is possible that the control module knows that a handoff/handover situation exists for the mobile device and sent a request to join the delayed multicast group to the BS/AP before the error detection and correction module informs the control module of any packet loss. The control module then does not have to send a duplicate join request after receiving the error notice from the error detection and correction module 345.

Figure 4:
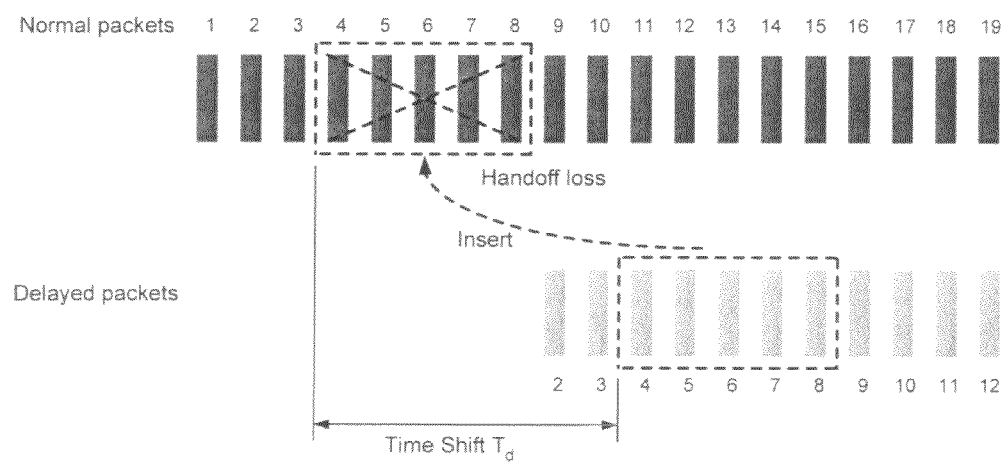
FIG. 4 is an example of packet loss recovery using staggercasting in accordance with the principles of the present invention.

FIG. 4 is an example of a packet loss recovery using staggercasting. Packets 4 through 8 in the normal video stream are lost due to handoff. The mobile device requests the delayed video stream (time shifted by an offset time $T_d$) from the BS/AP. When the delayed video stream arrives at the mobile device, packets 4 to 8 in the delayed video stream are inserted into the normal video stream.

After the packet loss is recovered, the error detection and correction module can inform the control module that the delayed recovery stream is no longer needed. The control module may send a request to the BS/AP to leave/unsubscribe/exit the delayed video multicast group. If this is the last mobile device that leaves the delayed multicast group, i.e. no mobile device wants the data in this delayed multicast group, the BS/AP will stop sending data to this delayed multicast group. It is noted that the present invention can also be used to recover from packet loss caused by other reasons such as shadowing and interference.

The time shift (offset time $T_d$) between the normal video packet stream and the delayed video packet recovery stream is a design parameter. The time shift is selected based on the length of packet loss burst due to handover. The length of handover loss should be less than $T_d$. The time shift can be the expected or average length of handover or it can be the maximum length of a handover.

An alternative embodiment is that instead of transmitting the duplicate video packet stream, a lower bit rate version of the normal video packet stream with reduced resolution/frame rate/quality video is transmitted in the delayed video multicast group. This method reduces the overhead. When the normal video data packets are lost during handoff, a lower quality version of the video is used by the mobile device to recover the lost packets, which allows for graceful degradation during handoff/handover situations.

Figure 5A:
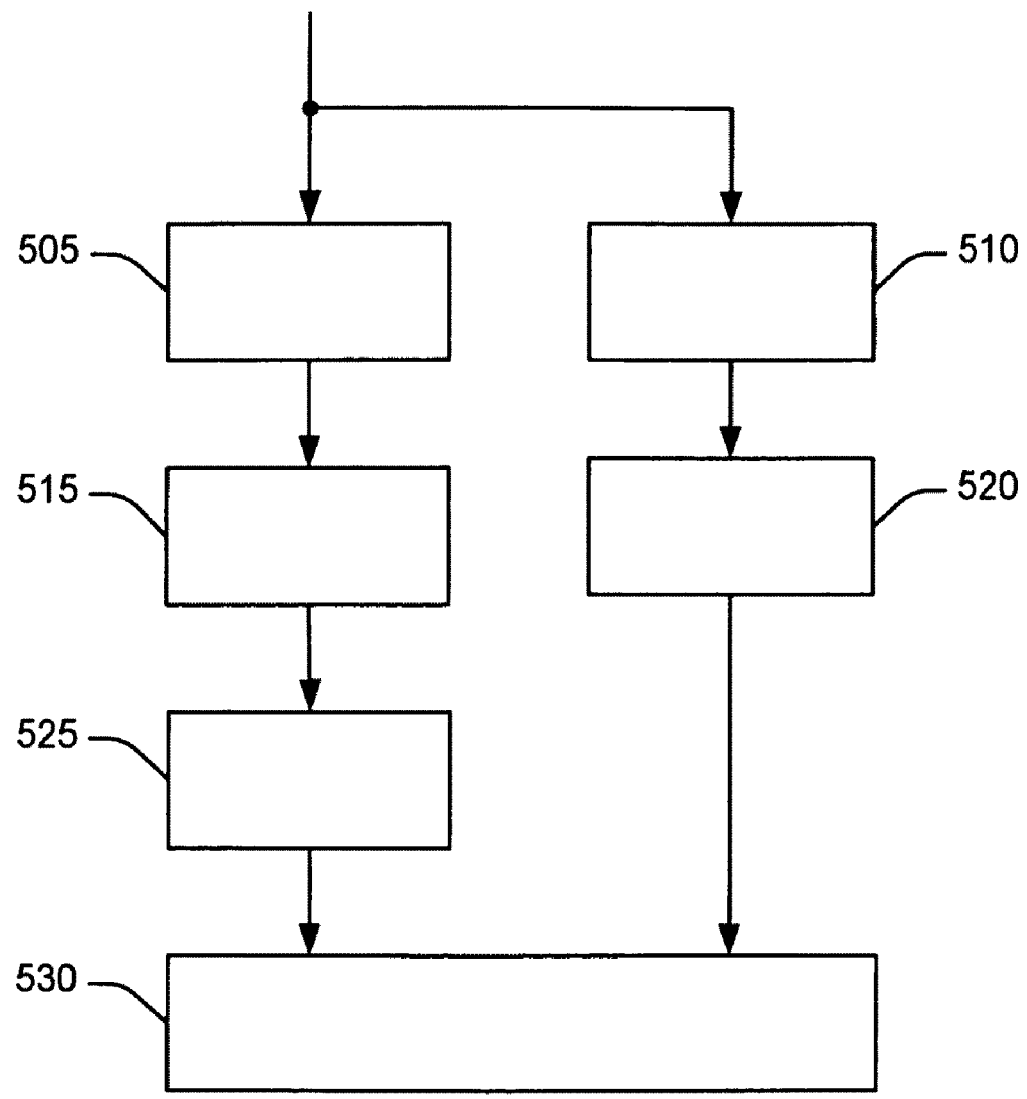
FIG. 5a is a flowchart of an exemplary video server/encoder implementation with lower quality video in the delayed recovery multicast group in accordance with the principles of the present invention.

FIG. 5a is a flowchart of an exemplary video server/sender implementation for video multicast over IP-based wireless networks using the reduced quality video in the delayed recovery IP multicast group. Video sequence data is received and encoded/transcoded/compressed at 505 and at 510. The difference is that at 505 the encoding/transcoding/compression of the video sequence data occurs at a lower bit rate to conserve bandwidth and provide graceful degradation of video in the event of handoff/handover packet loss. The encoding/transcoding/compression of the video sequence data at 510 occurs at the normal or standard bit rate for transmission of the video data. The encoded/transcoded/compressed video sequence data is packetized at 515 and 520. Once again the difference is that at 515 the packetization is performed on the lower bit rate video sequence data and at 520 the packetization is performed on the normal bit rate video sequence data. The encoded/transcoded/compressed packetized lower bit rate video sequence data is stored at 525 for an offset time $T_d$. Both the encoded/transcoded/compressed packetized normal bit rate video sequence data (data packets) and the encoded/transcoded/compressed packetized delayed (time shifted) lower bit rate video sequence data (data packets) are transmitted/multicast at 530. The delayed lower bit rate version of the video packets are transmitted/multicast to another IP multicast group (delayed recovery multicast group). The normal/original data packets are transmitted/multicast to an original/normal multicast group.

Figure 5B:
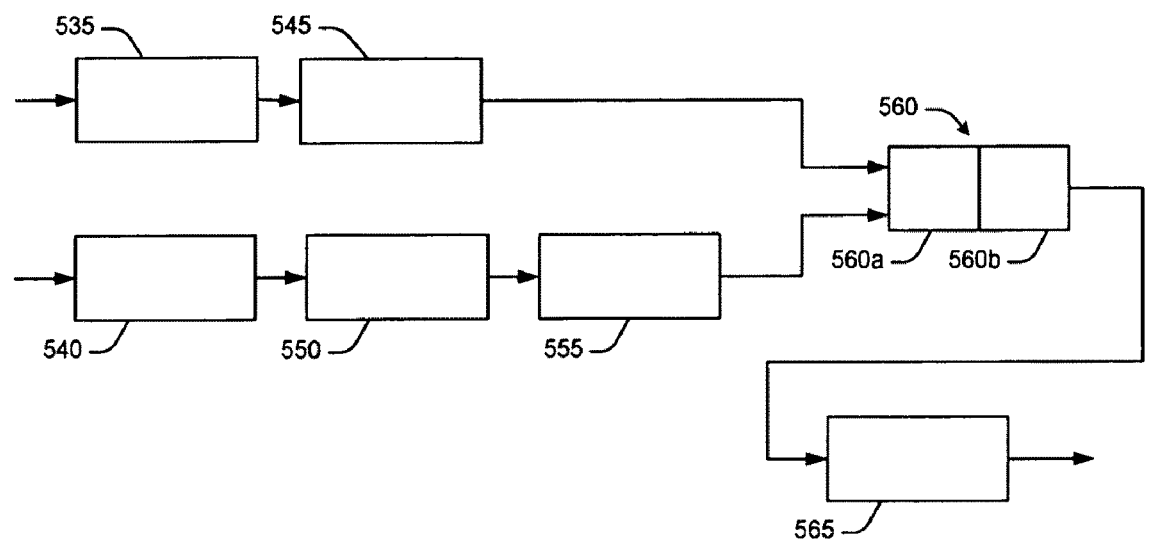
FIG. 5b is a schematic diagram of an exemplary video server/encoder implementation with lower quality video in the delayed recovery multicast group in accordance with the principles of the present invention.

FIG. 5b is a schematic diagram of an exemplary video server/sender implementation for video multicast over IP-based wireless networks using the reduced quality video in the delayed recovery IP multicast group. Video sequence data is received and encoded/transcoded/compressed by two source encoders/transcoders 535 and 540. Encoder/transcoder/compresser 535 is for the normal video and encoder/transcoder/compresser 540 is for the lower quality (lower bit rate) recovery video. The normal compressed video stream is packetized after compression by packetizer 545 and the packets are transmitted/multicast in an IP multicast group (normal video multicast group) through the UDP/IP stack 560 and Ethernet interface 565. The lower quality (lower bit rate) video is packetized by packetizer 550 after compression. The lower quality (lower bit rate) packets are stored in delay buffer 555 for an offset time $T_d$. The delayed (time shifted) lower quality (lower bit rate) video packets are transmitted/multicast to another IP multicast group (delayed/recovery multicast group) through the UDP/IP stack 560 and Ethernet interface 565 after delay. The protocol stack includes at least UDP layer 560a and IP layer 560b. Note that separate encoders may be implemented with one encoder selectably running with a higher processing speed to encode both normal video stream and lower quality recovery video stream. The components described herein may be hardware, software or firmware or any combination thereof including RISC, ASIC and/or FPGA.

Figure 6A:
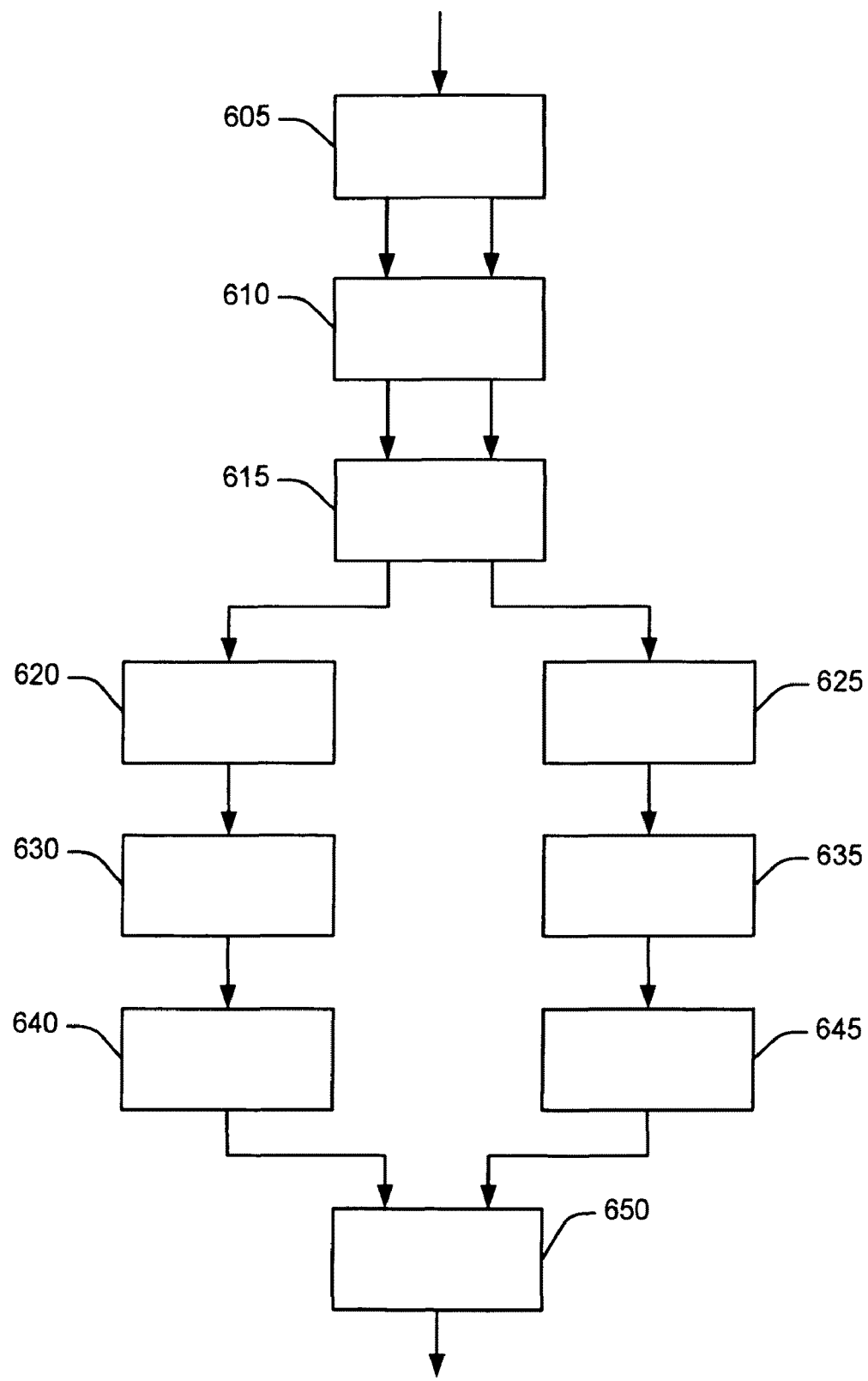
FIG. 6a is a flowchart of an exemplary mobile receiver implementation with lower quality video in the delayed recovery multicast group in accordance with the principles of the present invention.

FIG. 6a is a flowchart of an exemplary mobile receiver/device implementation for video multicast over IP-based wireless networks using the reduced quality video in the delayed recovery IP multicast group. The normal video packets and the delayed video packets are received from different multicast groups at 605. The normal video packets (video sequence data) and delayed video packets (video sequence data) are separated into a normal video packet stream and a delayed video packet stream at 610. Error detection is performed at 615. Error detection is performed to determine whether packets were missing in the normal video packet stream by recognizing the gaps in received packet sequence number for the normal video packet stream. It should be noted that one transmission error may result in multiple pictures decoded in error due to error propagation nature in compressed video sequence. Error detection is also performed to determine whether packets were missing in the delayed video packet stream by recognizing the gaps in received packet sequence number for the delayed-video packet stream.

The normal video packet stream is depacketized at 620 and the delayed video packet stream is depacketized at 625. The depacketized normal video stream is decoded at 630 and the depacketized delayed video stream is decoded at 635. Copies of the decoded normal video stream are stored at 640 and copies of the decoded delayed video stream are stored at 645. A selection is made at 650 to determine from which stream (normal or delayed) the decoded pictures are displayed. If a normal picture is decoded without error, it is always selected for display. If errors occur in the normal video stream and the corresponding delayed picture is decoded without error, the decoded delayed picture is selected for display. If both the normal picture and the corresponding delayed picture are decoded in error, other technique such as error concealment can be used for the normal picture and the concealed normal picture is selected for display.

Figure 6B:
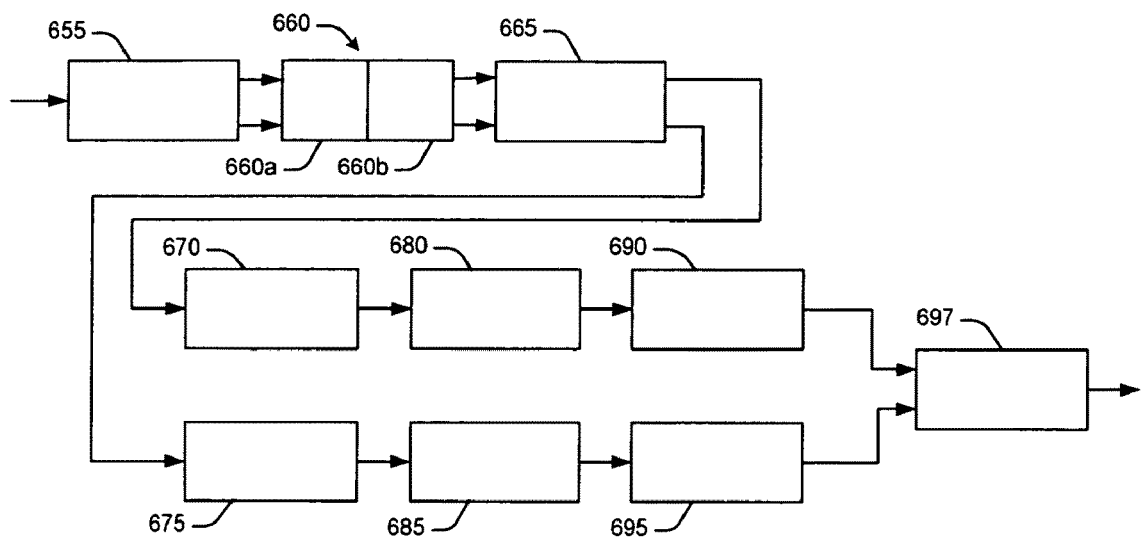
FIG. 6b is a schematic diagram of an exemplary mobile receiver implementation with lower quality video in the delayed recovery multicast group in accordance with the principles of the present invention.

FIG. 6b is a schematic diagram of an exemplary mobile receiver/device implementation for video multicast over IP-based wireless networks using the reduced quality video in the delayed recovery IP multicast group. The normal video packets and the delayed video packets are received from different multicast groups at an Ethernet/WLAN interface 655. The normal video packets (video sequence data) and delayed video packets (video sequence data) are separated into a normal video packet stream and a delayed video packet stream at protocol stack 660. Protocol stack includes at least UDP layer 660a and IP layer 660b. Error detection is performed by error detection module 665 to determine whether packets were missing in the normal video packet stream by recognizing the gaps in received packet sequence number for the normal video packet stream. It should be noted that one transmission error may result in multiple pictures decoded in error due to error propagation nature in compressed video sequence. Error detection is also performed to determine whether packets were missing in the delayed video packet stream by recognizing the gaps in received packet sequence number for the delayed video packet stream.

The normal video packet stream is communicated to depacketizer 670 and the delayed video packet stream is communicated to depacketizer at 675. Depacketizers 670 and 675 depacketize the error detected normal video stream and the error deteced delayed video stream respectively. The depacketized error detected normal video packet stream is communicated to normal video decoder 680 and the depacketized delayed video packet stream is communicated to delayed/recovery video decoder at 685. Decoders 680 and 685 decode the error detected depacketized normal video stream and the error detected depacketized delayed video stream respectively. Copies of the decoded depacketized error detected normal video stream are stored in normal video buffer 690 and copies of the decoded depacketized error detected delayed video stream are stored in recovery/delay video buffer 695. Selector 697 determines from which stream (normal or delayed) the decoded pictures are displayed. The normal video decoder knows which frames are in error in the normal video stream and informs selector 697. The delayed/recovery video decoder knows which frames are in error in the delayed recovery video stream and informs selector 697. If a normal picture is decoded without error, it is always selected for display. If errors occur in the normal video stream and the corresponding recovery picture is decoded without error, the decoded recovery picture is selected for display. If both the normal picture and the corresponding recovery picture are decoded in error, other technique such as error concealment can be used for the normal picture and the concealed normal picture is selected for display. It should be noted that the exemplary separate decoders may be implemented with one decoder running with a higher processing speed to decode both normal stream and recovery stream. The components described herein may be hardware, software or firmware or any combination thereof including RISC, ASIC and/or FPGA.

Figure 7:
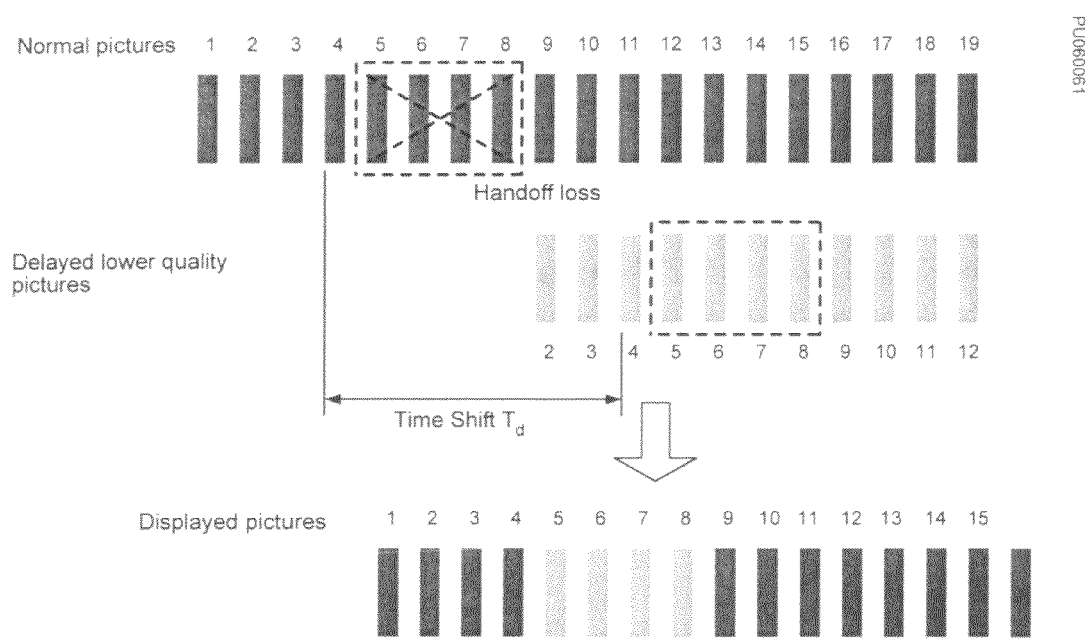
FIG. 7 is an example of packet loss recovery with lower quality video in the delayed recovery multicast group in accordance with the principles of the present invention.

FIG. 7 is an example packet loss recovery with lower quality video in the delayed recovery multicast group in accordance with the principles of the present invention. When packet loss occurs in the normal video stream due to handoff, the mobile device requests the delayed recovery video stream from the BS/AP. Video data from both the normal stream and the delayed recovery stream are decoded using the appropriate decoder. The normal video stream is delayed sufficiently at the normal video buffer that the corresponding recovery pictures are available at the recovery video buffer. Pictures 1-4 from the normal video stream are decoded without error so they are selected for display. Packet loss errors were detected in pictures 5 to 8 in the normal video stream. However, the corresponding pictures in the recovery video stream do not have packet loss errors so pictures 5 to 8 from the recovery video stream are selected for display.

In an alternative embodiment instead of transmitting the duplicate video stream or a lower quality video stream, parity packets generated by a cross-packet forward error correction code (FEC) are transmitted to the delayed recovery IP multicast group. A FEC code is applied to the video data packets to generate the parity packets. The video packet stream and the parity packet stream are multicast with a time shift to different IP multicast groups, i.e. staggercasting the video stream and the parity stream for temporal diversity.

Figure 8A:
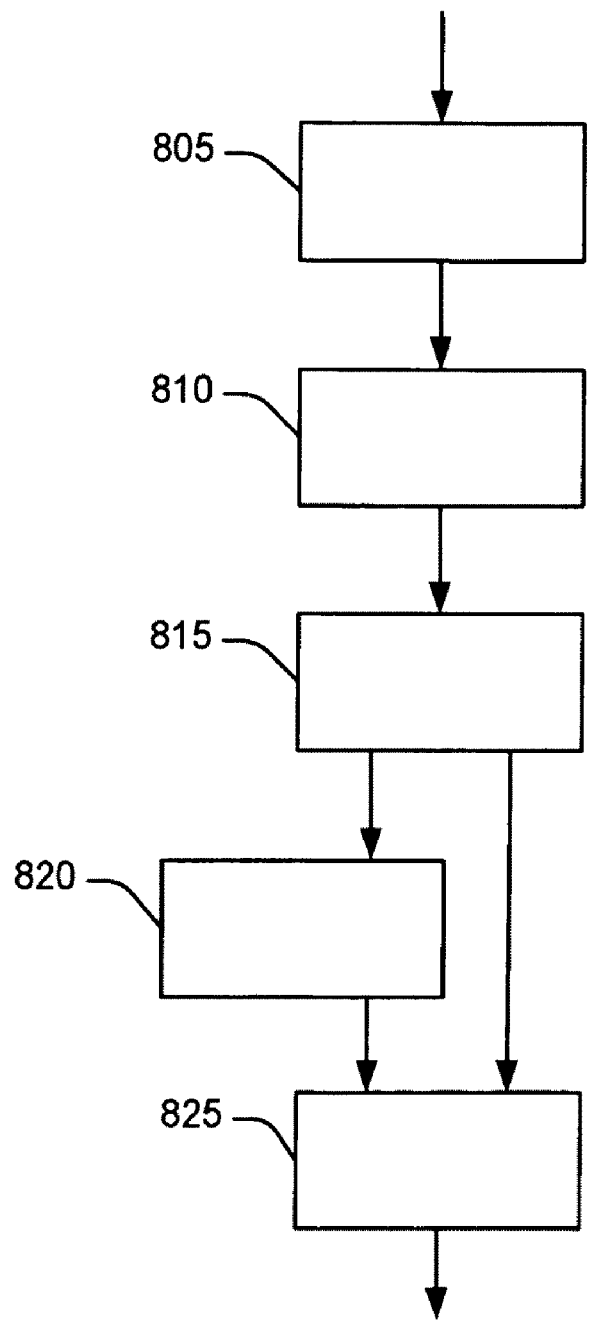
FIG. 8a is a flowchart of an exemplary video server/encoder implementation with parity packets generated by a cross-packet forward error correction (FEC) code in the delayed recovery multicast group in accordance with the principles of the present invention.

FIG. 8a is a flowchart of an exemplary transmitter/server implementation for video multicast over wireless IP networks using the FEC parity packets in the delayed recovery IP multicast group. Uncompressed video sequence data is received and encoded/transcoded/compressed at 805. The encoded/transcoded/compressed video sequence data is packetized and the packet header is added at 810. The packetized encoded/transcoded/compressed video sequence data is then FEC encoded at 815 to form FEC parity packets. The FEC codes are applied across video packets to generate the parity packets. The header is added in the FEC packets containing FEC information. The extra FEC related header may also be added to the video data packets depending on the FEC coding scheme. The video data packets are then transmitted/multicast to an IP multicast group (normal video multicast group) at 825. The parity packets are stored at 820 for an offset time $T_d$. The FEC parity packets are transmitted/multicast to another IP multicast group (delayed/recovery multicast group) at 825 after a delay/time shift $T_d$.

Figure 8B:
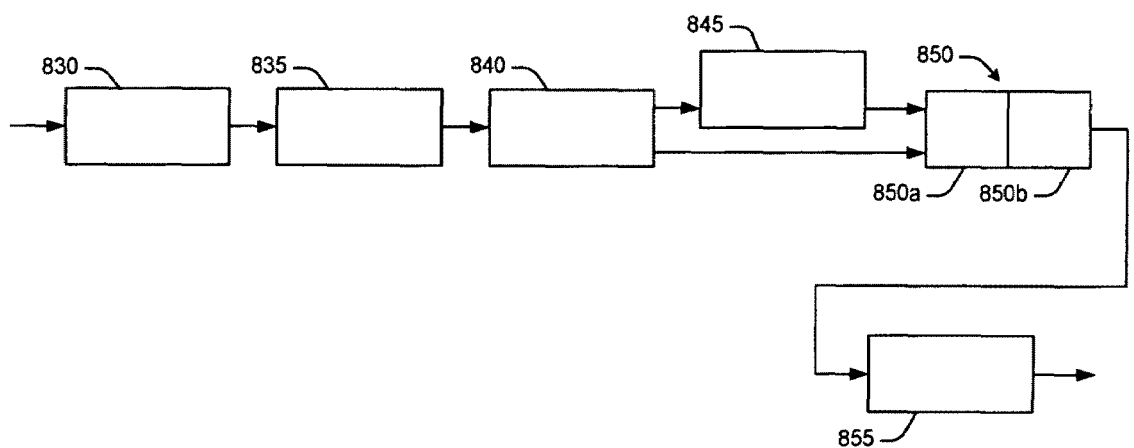
FIG. 8b is a schematic diagram of an exemplary video server/encoder implementation with parity packets generated by a cross-packet forward error correction (FEC) code in the delayed recovery multicast group in accordance with the principles of the present invention.

FIG. 8b is a schematic diagram of an exemplary transmitter/server implementation for video multicast over wireless IP networks using the FEC parity packets in the delayed recovery IP multicast group. Video encoder/transcoder/compresser 830 receives uncompressed video sequence data and encodes/transcodes/compresses the uncompressed video sequence data. The encoded/transcoded/compressed video sequence data is communicated to packetizer 835, which packetizes the encoded/transcoded/compressed video sequence data to form data packets and add the packet header. The packetized encoded/transcoded/compressed video sequence data is then communicated to FEC encoder 840 to form parity packets. The FEC encoder is placed after the packetization, but before the protocol stack 850. The FEC codes are applied across the video packets to generate the parity packets. The header is added in the FEC packets containing FEC information. The FEC related header may also be added to the video data packets depending on the FEC coding scheme. The video data packets are transmitted/multicast to an IP multicast group (normal video multicast group) through the protocol stack 850 and Ethernet/WLAN interface 855. The protocol stack 850 includes at least UDP layer 850a and IP layer 850b. The parity packets are stored in the delay buffer 845 for an offset time $T_d$. The FEC parity packets are transmitted/multicast to another IP multicast group (delayed/recovery multicast group) via the protocol stack 850 and Ethernet/WLAN interface. 855 after a delay/time shift $T_d$. The components described herein may be hardware, software or firmware or any combination thereof including RISC, ASIC and/or FPGA.

Figure 9:
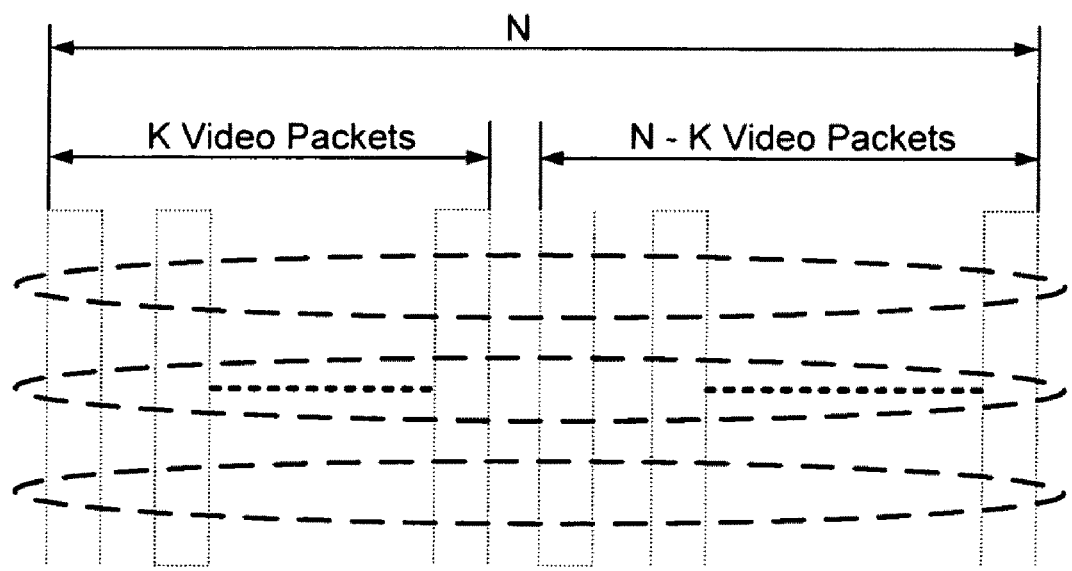
FIG. 9 is an example of cross-packet encoding in accordance with the principles of the present invention.

FIG. 9 is an example of cross-packet encoding in accordance with the principles of the present invention. As shown in FIG. 9, K video packets are grouped together and Reed-Solomon (RS) (N, K) code is applied to the packet group to generate N-K parity packets. The header is added to the FEC packets containing FEC information including which video packets this FEC packet protects. The FEC related header may also be added to the video packets depending on the FEC coding scheme. The video data packets are transmitted to an IP multicast group (normal video multicast group) via the UDP/IP stack and Ethernet interface. The parity packets are then stored in a delay buffer for an offset time $T_d$. The FEC parity packets are transmitted to another IP multicast group (delayed/recovery multicast group) via the UDP/IP and Ethernet interface after a delay/time shift $T_d$.

Figure 10A:
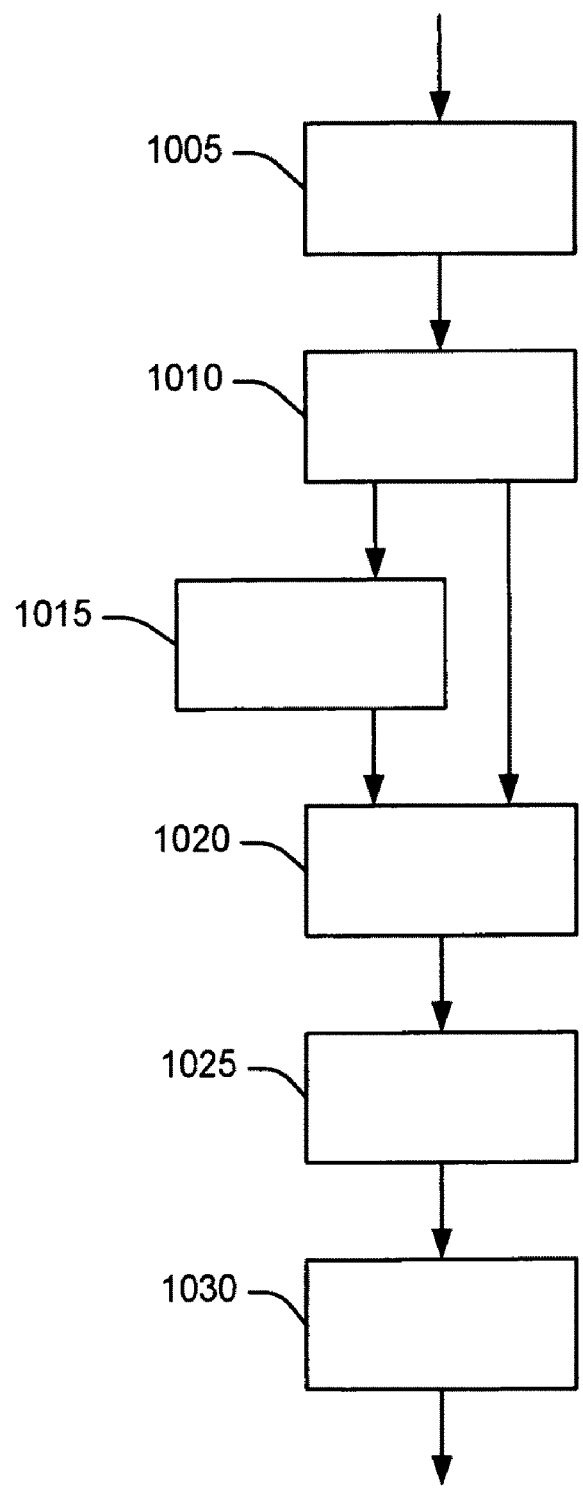
FIG. 10a is a flowchart of an exemplary mobile receiver implementation with parity packets generated by a cross-packet FEC code in the delayed recovery multicast group in accordance with the principles of the present invention.

FIG. 10a is a flowchart of an exemplary mobile receiver/device implementation for video multicast over IP-based wireless networks using the FEC parity packets in the delayed/recovery multicast group. Normal video data packets containing video sequence data and the delayed parity packets are received from different multicast groups at 1005. They are separated into video packets and parity packets at 1010. The received video data packets are stored at 1015. The erroneous video and parity packets are discarded by the link layer (WLAN interface). FEC erasure decoding is performed at 1020. The positions of lost video data packets or parity packets are detected through the sequence number in the packet header by the FEC erasure decoding process. The FEC header in the parity packets and/or in the video data packets is used to determine the FEC block information. With the RS (N, K) code, as long as any K or more packets out of N packets in the FEC coding block (regardless whether video data packets or parity packets) are correctly received, the FEC erasure decoding process can reconstruct the original (normal) video packets. The FEC erasure decoding process is a reverse process of the FEC encoding process, which is performed across the packets with one symbol from each packet to consist of the codeword. The FEC erasure decoded video data packets are depacketized at 1025. The depacketized video data packets are then video decoded at 1030 to produce decoded video for display.

One embodiment uses a half-rate RS code. For the RS code with erasure decoding, each parity packet can recover any one lost packet in the coding block. When a half-rate RS (N, K) code (N=2K) is applied to the K video packets, it generates K parity packets. With the half-rate RS code, even if video data packets are completely lost in a burst during handover, the lost data packets can be recovered from the corresponding parity packets alone. In this sense, the parity packet stream generated by the half-rate RS code is an alternative to the original (normal) video packet stream. It should be noted that besides Reed-Solomon (RS) codes, other FEC codes can also be used to generate parity packets.

Figure 10B:
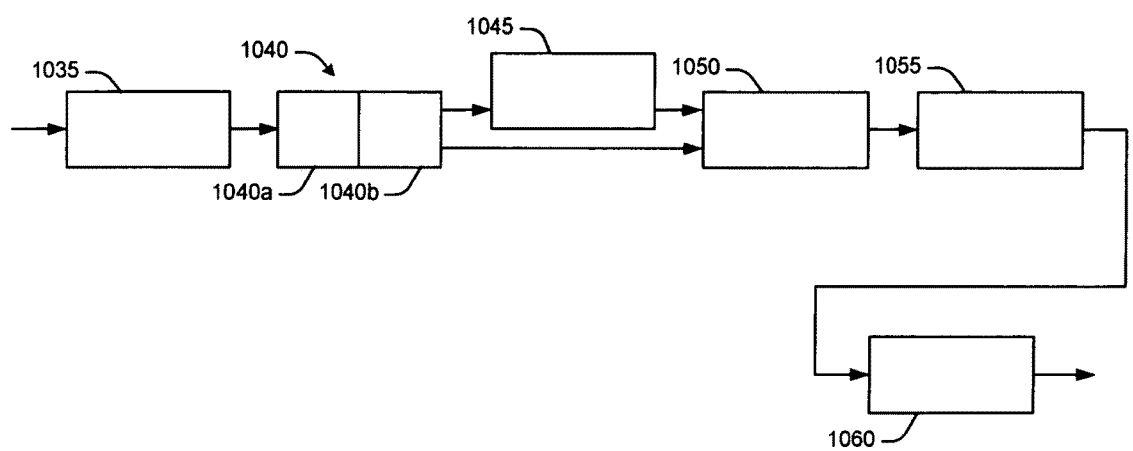
FIG. 10b is a schematic diagram of an exemplary mobile receiver implementation with parity packets generated by a cross-packet FEC code in the delayed recovery multicast group in accordance with the principles of the present invention.

FIG. 10b is a schematic diagram of an exemplary mobile receiver/device implementation for video multicast over IP-based wireless networks using the FEC parity packets in the delayed/recovery multicast group. Normal video data packets and the delayed parity packets are received from different multicast groups at the WLAN/Ethernet interface 1035. They are separated into video data packets and parity packets by protocol stack 1040, which includes at least UDP layer 1040a and IP layer 1040b. The received video data packets are delayed in buffer 1045. The erroneous video and parity packets are discarded by the link layer (WLAN interface). The FEC erasure decoding module 1050 is between the de-packetization and UDP layer. The positions of lost video data packets or parity packets are detected through the sequence number in the packet header by the FEC erasure decoding module 1050, which is used for erasure decoding. The FEC header in the parity packets and/or in the video packets is used by FEC erasure decoding module 1050 to determine the FEC block information. With the RS (N, K) code, as long as any K or more packets out of N packets in the FEC coding block (regardless whether video data packets or parity packets) are correctly received, the FEC erasure decoding module 1050 can reconstruct the original (normal) video data packets. The FEC erasure decoding is a reverse process of the FEC encoding process, which is performed across the packets with one symbol from each packet to consist of the codeword. The FEC erasure decoded video data packets are communicated to depacketizer 1055, which depacketizes the video data packets. The depacketized video data packets are then communicated to video decoder module 1060. The components described herein may be hardware, software or firmware or any combination thereof including RISC, ASIC and/or FPGA.

If no return wireless channel from the mobile device to the BS/AP is available and/or a simple system implementation is preferred, the BS/AP may always transmit the normal video stream and delayed recovery stream in multicast over the wireless networks. The mobile receiver/device receives both streams without requesting them.

Another embodiment is to use staggercasting to layered/scalable video coding. Only the base layer for the scalable coder is staggered in time using the present invention. The normal base layer video data packets are sent multicast in the normal multicast group as described above. The duplicate base layer data or its parity data generated by a cross-packet FEC encoder is transmitted multicast with a time delay in the delayed multicast group. The normal enhancement layer data packets are sent in another multicast group without delay. The overhead associated with using staggercasting is thus reduced. When the normal video (both base layer and enhancement layer) is lost, the base layer recovered by the packets in the delayed recovery multicast group can provide a lower quality video. This leads to a graceful degradation during handoff.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

The invention claimed is:

1. A method performed by a mobile device for recovering from loss of a first data packet, said method comprising:
   detecting data packet loss;
   joining a first multicast group, wherein said joining step is performed when a mobile device is handed off from a first access point to a second access point;
   receiving a second data packet; and using said second data packet to recover said first data packet that was lost, wherein said joining step is performed when data packet loss is detected.

2. The method according to claim 1, wherein said second data packet is one of a copy of said first data packet and a copy of said first data packet encoded at a lower bit rate.

3. The method according to claim 2, wherein said using step further comprises substituting said second data packet for said lost first data packet.

4. The method according to claim 2, further comprising:
joining a second multicast group;
receiving said first data packet;
separating said first data packet and said second data packet;
performing error detection on said first data packet and said second data packet;
storing said first data packet;
selecting one of said first data packet and said second data packet;
depacketizing said selected data packet; and
decoding said depacketized selected data packet.

5. The method according to claim 4, wherein said performing step further comprises recognizing gaps in received packet sequence numbers.

6. The method according to claim 2, further comprising:
joining a second multicast group;
receiving said first data packet;
separating said first data packet and said second data packet;
performing error detection on said first data packet and said second data packet;
depacketizing said first data packet and said second data packet;
decoding said first data packet and said second data packet;
storing said decoded first data packet and said decoded second data packet; and
selecting one of said decoded first data packet and said decoded second data packet.

7. The method according to claim 1, wherein said second data packet is a parity packet.

8. The method according to claim 7, wherein said parity packet is a forward error correction encoded parity packet.

9. The method according to claim 7, wherein said using step further comprises performing erasure decoding to recover said lost first data packet.

10. The method according to claim 7, further comprising:
joining a second multicast group;
receiving said first data packet and said parity packet;
separating said first data packet and said parity packet;
storing said first data packet;
performing forward error correction erasure decoding on said first data packet and said parity packet to obtain recovered first data packet;
depacketizing said recovered first data packet; and
decoding said recovered first data packet.

11. The method according to claim 1, wherein an access point is a base station.

12. The method according to claim 11, further comprising leaving said first multicast group when said second data packet corresponding to said lost first data packet has been received.

13. The method according to claim 1, wherein said second data packet is time-shifted by a pre-determined offset time.

14. The method according to claim 13, wherein said pre-determined offset time is greater than one of an expected handoff duration and a maximum handoff duration.

15. The method according to claim 1, wherein a request to join said first multicast group is made to one of a base station and an access point and a corresponding request to leave said first multicast group is made to one of said base station and said access point.

16. The method according to claim 1, wherein a request to join said first multicast group is made to an Ethernet switch and a corresponding request to leave said first multicast group is made to said Ethernet switch.

17. An apparatus for recovering from loss of an first data packet, comprising:
means for detecting data packet loss;
means for joining a first multicast group, wherein said means for joining is performed when a mobile device is handed off from a first base station to a second base station;
means for receiving a second data packet; and
means for using said second data packet to recover said first data packet that was lost, wherein said means for joining is performed when data packet loss is detected.

18. The apparatus according to claim 17, wherein said second data packet is one of a copy of said first data packet and a copy of said first data packet encoded at a lower bit rate.

19. The apparatus according to claim 18, wherein said means for using further comprises means for substituting said second data packet for said lost first data packet.

20. The apparatus according to claim 18, further comprising:
means for joining a second multicast group;
means for receiving said first data packet;
means for separating said first data packet and said second data packet;
means for performing error detection on said first data packet and said second data packet;
means for storing said first data packet;
means for selecting one of said first data packet and said second data packet;
means for depacketizing said selected data packet; and
means for decoding said depacketized selected data packet.

21. The apparatus according to claim 20, wherein said means for performing further comprises means for recognizing gaps in received packet sequence numbers.

22. The apparatus according to claim 18, further comprising:
means for joining a second multicast group;
means for receiving said first data packet and said second data packet;
means for separating said first data packet and said second data packet;
means for performing error detection on said first data packet and said second data packet;
means for depacketizing said first data packet and said second data packet;
means for decoding said first data packet and said second data packet;
means for storing said decoded first data packet and said decoded second data packet; and
means for selecting one of said decoded first data packet and said decoded second data packet.

23. The apparatus according to claim 17, wherein said second data packet is a parity packet.

24. The apparatus according to claim 23, wherein said means for using further comprises means for performing erasure decoding to recover said lost first data packet.

25. The apparatus according to claim 23, further comprising:
- means for joining a second multicast group;
- means for receiving said first data packet and said parity packet;
- means for separating said first data packet and said parity packet;
- means for storing said first data packet;
- means for performing forward error correction erasure decoding on said first data packet and said parity packet to obtain said recovered first data packet;
- means for depacketizing said recovered first data packet; and
- means for decoding said recovered first data packet.

26. The apparatus according to claim 17, further comprising means for leaving said first multicast group when said second data packet corresponding to said lost first data packet has been received.

27. The apparatus according to claim 17, wherein said second data packet is time-shifted by a pre-determined offset time.

28. The apparatus according to claim 17, wherein a request to join said first multicast group is made to one of a base station and an access point and a corresponding request to leave said first multicast group is made to one of said base station and said access point.

29. The apparatus according to claim 19, wherein a request to join said first multicast group is made to an Ethernet switch and a corresponding request to leave said first multicast group is made to said Ethernet switch.

30. The apparatus according to claim 17, wherein said apparatus is a mobile device.

31. A method for staggercasting, said method comprising:
- encoding and compressing a first data sequence;
- packetizing said compressed encoded data sequence to form an first data packet;
- multicasting said first data packet to a first multicast group;
- generating a second data sequence related to said first data sequence;
- packetizing said second data sequence to form a packet;
- multicasting said packet second by an offset time to a second multicast group.

32. The method according to claim 31, further comprising adding a packet header to said data packet.

33. The method according to claim 31, wherein said offset time is pre-determined.

34. The method according to claim 33, wherein said pre-determined offset time is greater than one of an expected handoff duration and a maximum handoff duration.

35. The method according to claim 31, wherein said packet is one of a copy of said first data packet and a copy of said first data packet encoded at a lower bit rate.

36. The method according to claim 31, wherein said packet is a parity packet.

* * * * *